US008916438B2

United States Patent
Lin (10) Patent No.: US 8,916,438 B2
(45) Date of Patent: Dec. 23, 2014

(54) METHOD FOR FABRICATING TRENCH TYPE TRANSISTOR

(71) Applicant: Anpec Electronics Corporation, Hsin-Chu (TW)

(72) Inventor: Yung-Fa Lin, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 21 days.

(21) Appl. No.: 13/740,250

(22) Filed: Jan. 13, 2013

(65) Prior Publication Data

US 2014/0170823 A1 Jun. 19, 2014

(30) Foreign Application Priority Data

Dec. 13, 2012 (TW) .............................. 101147262 A (51) Int. Cl.
*H01L 29/66* (2006.01)

(52) U.S. Cl.
CPC ............................. *H01L 29/66666* (2013.01)
USPC ......................................................... 438/270

(58) Field of Classification Search
USPC ......................................................... 438/270
See application file for complete search history.

(56) References Cited

U.S. PATENT DOCUMENTS

| | | | | |
|---|---|---|---|---|
| 5,270,257 A * | 12/1993 | Shin | ................... | 438/300 |
| 7,504,306 B2 * | 3/2009 | Sapp et al. | ................... | 438/270 |
| 7,867,852 B2 * | 1/2011 | Hebert | ................... | 438/270 |
| 2002/0061623 A1 * | 5/2002 | Hshieh et al. | ................... | 438/268 |
| 2002/0115257 A1 * | 8/2002 | Inagawa et al. | ................... | 438/270 |
| 2005/0032287 A1 * | 2/2005 | Nakazawa et al. | ................... | 438/197 |
| 2006/0091456 A1 * | 5/2006 | Montgomery | ................... | 257/330 |
| 2006/0267090 A1 * | 11/2006 | Sapp et al. | ................... | 257/341 |
| 2006/0273388 A1 * | 12/2006 | Yamazaki | ................... | 257/330 |
| 2007/0111446 A1 * | 5/2007 | Spring | ................... | 438/259 |
| 2010/0032751 A1 * | 2/2010 | Hebert | ................... | 257/330 |
| 2011/0159651 A1 * | 6/2011 | Matsui et al. | ................... | 438/270 |
| 2012/0146090 A1 * | 6/2012 | Lui et al. | ................... | 257/139 |
| 2012/0205668 A1 * | 8/2012 | Watanabe | ................... | 257/77 |

* cited by examiner

*Primary Examiner* — Charles Garber
*Assistant Examiner* — Stanetta Isaac
(74) *Attorney, Agent, or Firm* — Winston Hsu; Scott Margo (57) ABSTRACT

A method for fabricating a trench type transistor. An epitaxial layer is provided on a semiconductor substrate. A hard mask with an opening is formed on the epitaxial layer. A gate trench is etched into the substrate through the opening. A gate oxide layer and a trench gate are formed within the gate trench. After forming a cap layer atop the trench gate, the hard mask is removed. An ion well and a source doping region are formed in the epitaxial layer. A spacer is then formed on a sidewall of the trench gate and the cap layer. Using the cap layer and the spacer as an etching hard mask, the epitaxial layer is etched in a self-aligned manner, thereby forming a contact hole.

8 Claims, 10 Drawing Sheets

METHOD FOR FABRICATING TRENCH TYPE TRANSISTOR

BACKGROUND OF THE INVENTION

1. Field of the Invention

The present invention relates generally to the field of semiconductor technology. More particularly, the present invention relates to a method for fabricating a trench type transistor.

2. Description of the Prior Art

As known in the art, the rise of on-resistance of traditional planar power DMOS devices (DMOS) is contributed from the channel region, the accumulation layer and junction field effect transistor (JFET).

In order to reduce the resistance of the above-mentioned area, trench type power devices (UMOS) are proposed. Since JFET region does not exist in a UMOS, the cell size can be reduced and the channel density is increased, thereby resulting in a lower on-resistance. However, as the cell size shrinks, the gap or space between the gate and the contact window also reduces, leading to overly issues.

SUMMARY OF THE INVENTION

It is therefore one object of the present invention to provide an improved trench type power semiconductor device and fabrication method thereof in order to solve the above-mentioned overlay problems.

According to an embodiment, a method for fabricating a trench type transistor device is disclosed. A semiconductor substrate is provided. An epitaxial layer is grown on the semiconductor substrate. A hard mask layer is formed on the epitaxial layer. The hard mask layer comprises at least an opening. Through the opening, a gate trench is etched into the epitaxial layer. A gate oxide layer is then formed in the gate trench. A gate is formed within the gate trench. A cap layer is formed on the gate. The hard mask layer is then removed. An ion well is formed within the epitaxial layer. A source doping region is formed within the ion well. A spacer is then formed on sidewall of the cap layer and the gate. A self-aligned etching process is then performed to etch the epitaxial layer using the cap layer and the spacer as an etching hard mask, thereby forming a contact hole.

According to another embodiment, a semiconductor substrate is provided. An epitaxial layer is grown or deposited on the semiconductor substrate. A nitride doping region is then formed at a surface of the epitaxial layer. A hard mask layer is formed on the epitaxial layer. The hard mask layer comprises at least an opening. Through the opening, a gate trench is etched into the epitaxial layer. A gate oxide layer is then formed in the gate trench. A gate is formed within the gate trench. The hard mask layer is removed such that the gate protrudes from the surface of the epitaxial layer. An ion well is formed within the epitaxial layer. A source doping region is formed within the ion well. An upper portion of the gate that protrudes from the surface of the epitaxial layer is selectively oxidized to thereby form an oxide capping layer. Using the oxide capping layer as an etching hard mask, the epitaxial layer is self-aligned etched to thereby form a contact hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
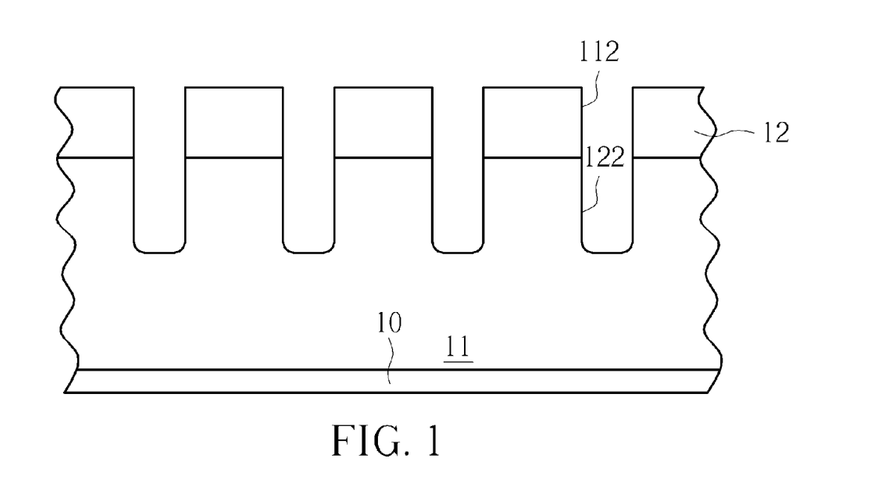
FIGS. 1-8 are schematic, cross-sectional diagrams illustrating a method for fabricating a trench type power transistor device in accordance with one embodiment of the invention.

FIGS. 1-8 are schematic, cross-sectional diagrams illustrating a method for fabricating a trench type power transistor device in accordance with one embodiment of the invention. As shown in FIG. 1, a semiconductor substrate 10, such as an N type heavily doped silicon substrate, is provided. The semiconductor substrate 10 may act as a drain of the semiconductor transistor device. Subsequently, an epitaxial process is performed to form an epitaxial layer 11 such as an N type epitaxial silicon layer on the semiconductor substrate 10. A hard mask layer 12 such as a silicon oxide or silicon nitride may be formed on the epitaxial layer 11. A lithographic process and an etching process are performed to form openings 112 in the hard mask layer 12. Subsequently, a dry etching process is performed to etch the epitaxial layer 11 through the openings 112 to a predetermined depth within epitaxial layer 11, thereby forming gate trenches 122.

Figure 2:
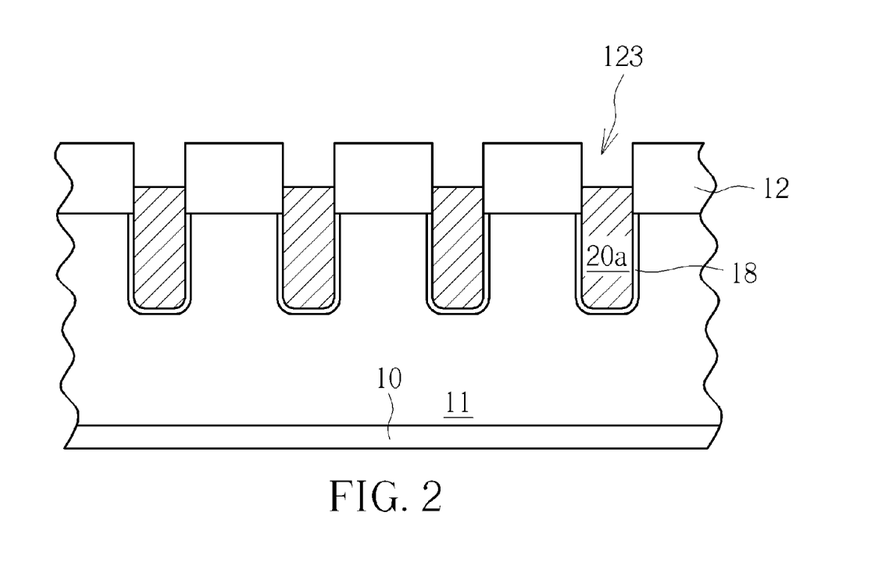

As shown in FIG. 2, a thermal oxidization process is performed to form a gate oxide layer 18 on the surface of each of the gate trenches 122. A chemical vapor deposition (CVD) process is carried out to deposit a polysilicon layer (not shown) in a blanket manner. The deposited polysilicon layer fills the gate trenches 122. Subsequently, an etching process is performed to etch away a portion of the polysilicon layer to thereby separate trench gates 20a within the gate trenches 122. At this point, a recess region 123 is formed on the trench gate 20a. It is to be understood that the trench gate 20a may be composed of polysilicon, metals or metal silicides, but not limited thereto.

Figure 3:
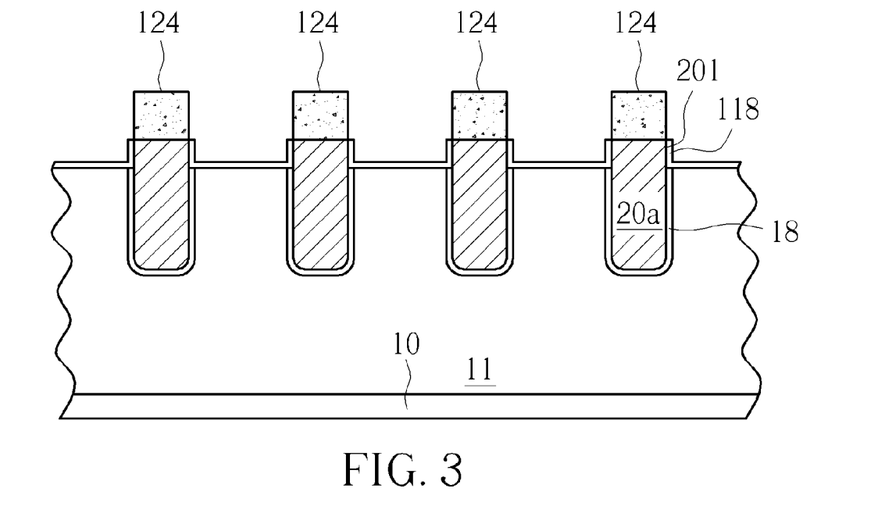

As shown in FIG. 3, a CVD process is carried out to deposit a dielectric layer (not explicitly shown) such as silicon nitride in a blanket manner. The dielectric layer fills into the recess region 123. Thereafter, an etching back process or a planarization process is performed to remove the excess dielectric layer outside the recess region 123 and thereby expose the hard mask layer 12. The remanent dielectric layer in the recess region 123 forms a cap layer 124. Subsequently, the exposed hard mask layer 12 is removed using methods known in the art. At this point, the trench gate 20a slightly protrudes from the surface of the epitaxial layer 11 and a sidewall 201 is revealed. An oxidization process may be performed to form a silicon oxide layer 118 on the sidewall 201.

Figure 4:
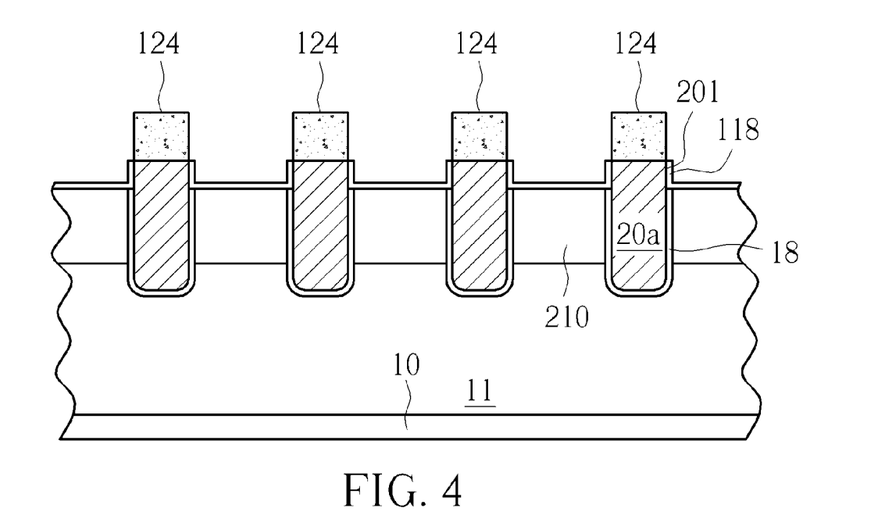

As shown in FIG. 4, an ion implantation process is performed to form an ion well 210 such as a P well within the epitaxial layer 11. A thermal treatment may be performed to thermally drive in and diffuse the implanted dopants. A lithographic process may be carried out prior to the aforesaid ion implantation process in order to define the well region to be implanted.

Figure 5:
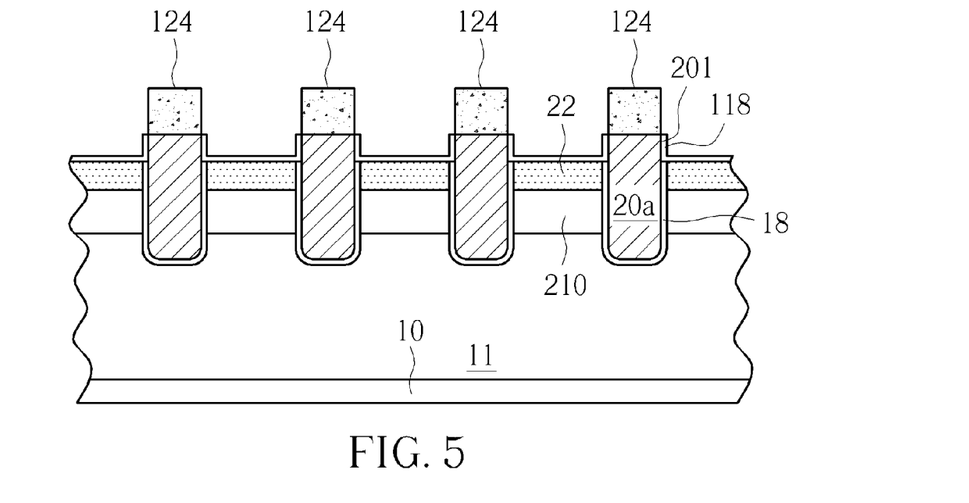

As shown in FIG. 5, another ion implantation process is performed to form source doping region 22 such as N type source doping region within the ion well 210. A thermal treatment may be performed to thermally drive in and diffuse the implanted dopants. Likewise, a lithographic process may be carried out prior to the aforesaid ion implantation process in order to define the source region to be implanted.

Figure 6:
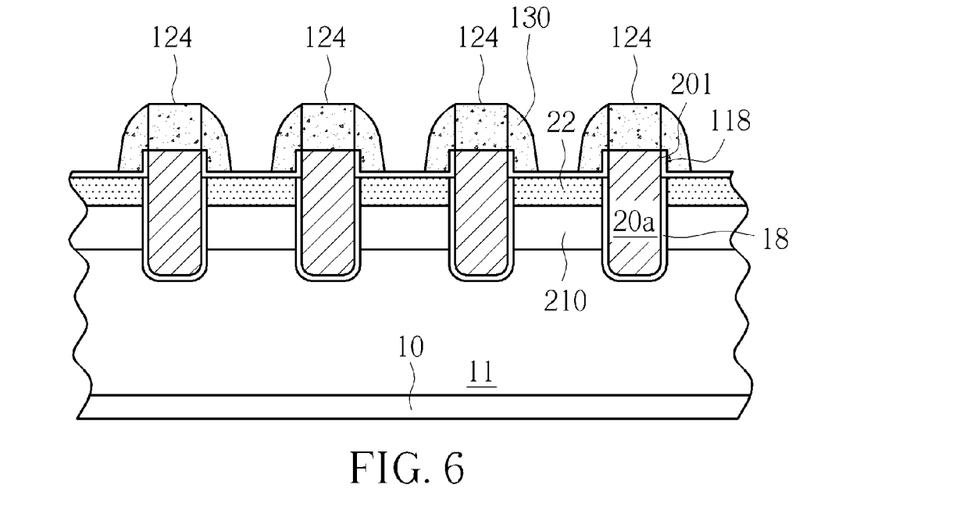

As shown in FIG. 6, a CVD process is carried out to deposit a spacer material layer (not explicitly shown) such as a silicon nitride layer in a blanket manner. The spacer material layer is then etched back to form a spacer 130 on each sidewall 201 of the trench gate 20a and the cap layer 124.

Figure 7:
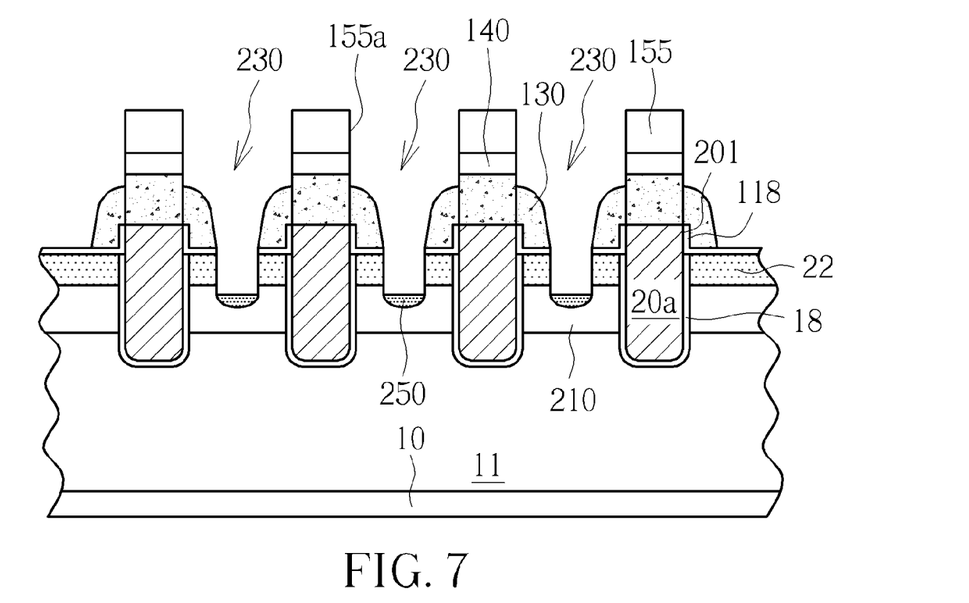

As shown in FIG. 7, a CVD process is performed to deposit a dielectric layer 140 in a blanket manner. The dielectric layer 140 covers the cap layers 124 and the spacers 130, and fills the space between the spacers 130. A lithographic process is then performed to form a resist pattern 155 on the dielectric layer 140. The resist pattern 155 comprises an opening 155a that defines the position of a contact hole to be formed. Subsequently, using the resist pattern 155 as an etching hard mask, the dielectric layer 140 is selectively etched through the opening 155a to thereby reveal the spacers 130. The epitaxial layer 11 is then selectively etched to a predetermined depth, thereby forming a self-aligned contact hole 230. The resist pattern 155 is then removed. A contact hole ion implantation process is performed to form a contact doping region 250 such as a P+ doping region at the bottom of the contact hole 230. Thereafter, a rapid thermal anneal may be carried out. Since the high selectivity between the spacer and the epitaxial layer 11, the etching of the contact hole is performed in a self-aligned manner and the profile of the contact hole is defined by the surface of the spacers 130.

Figure 19:
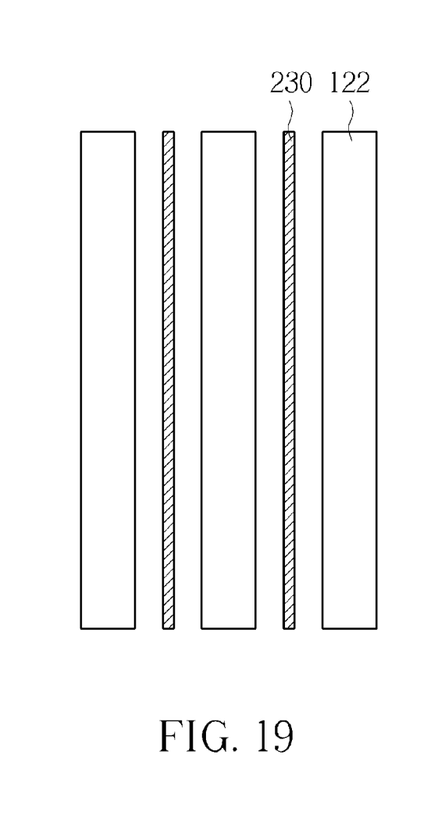
FIGS. 19-21 depict various layouts of the aforesaid contact hole and the aforesaid gate trench.
Figure 20:
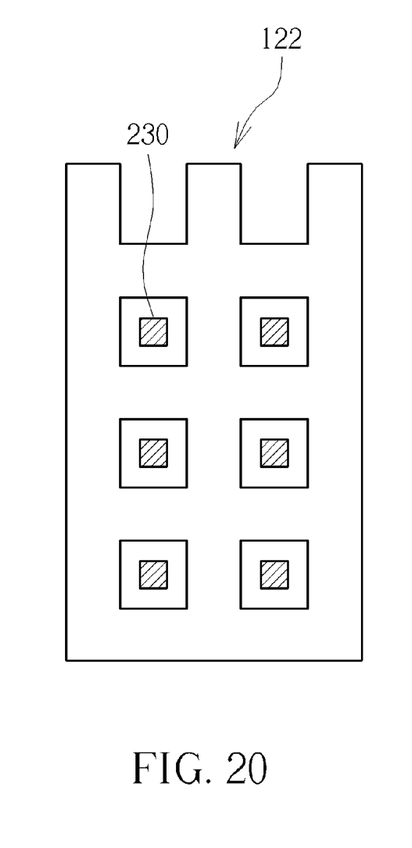
Figure 21:
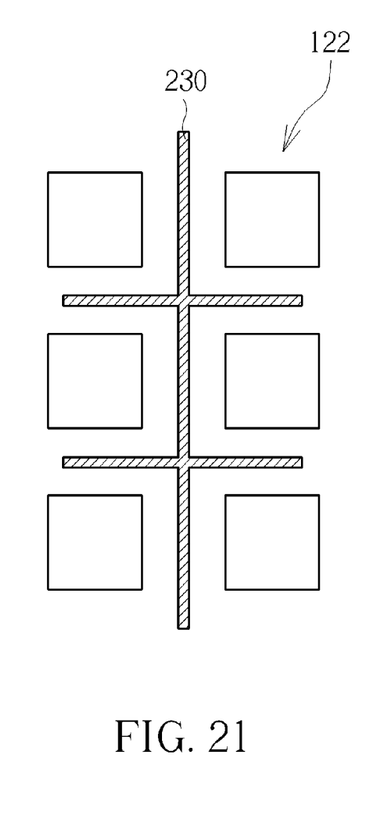

FIGS. 19-21 depict various layouts of the aforesaid contact hole 230 and the aforesaid gate trench 122. For example, FIG. 19 depicts straight line shaped or stripe shaped gate trench 122 and contact hole 230. FIG. 20 depicts mesh like gate trench 122 and isolated contact hole surrounded by the gate trench 122. FIG. 21 depicts grid shaped contact hole 230 and isolated gate trench 122 separated by the grid shaped contact hole 230. Of course, the depicted layouts or patterns are exemplary. It is to be understood that the present invention may be applicable to other layout patterns.

Figure 8:
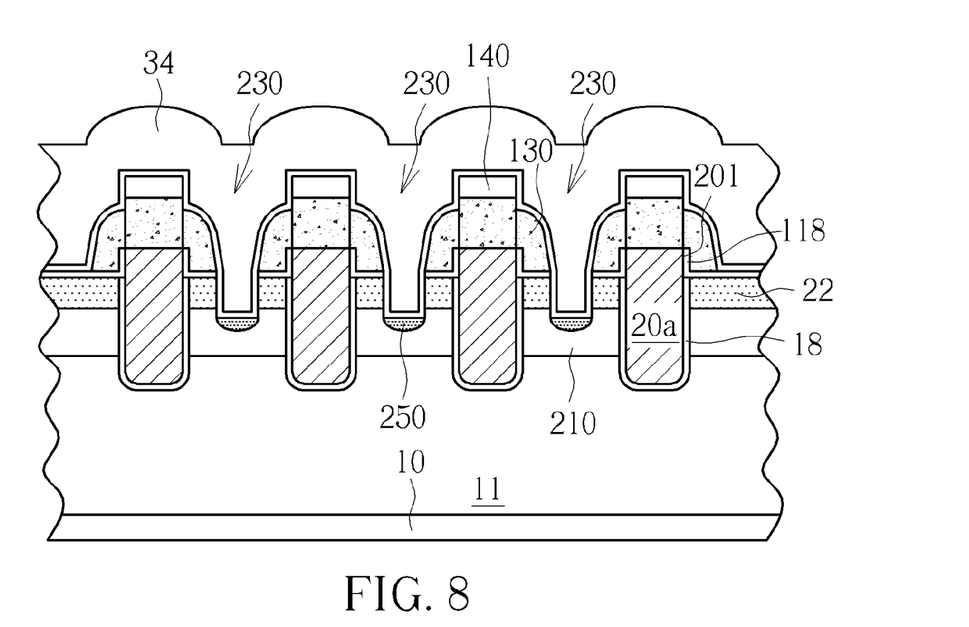

As shown in FIG. 8, a barrier layer and a metal layer 34 may be deposited to fill the contact hole 230.

Figure 9:
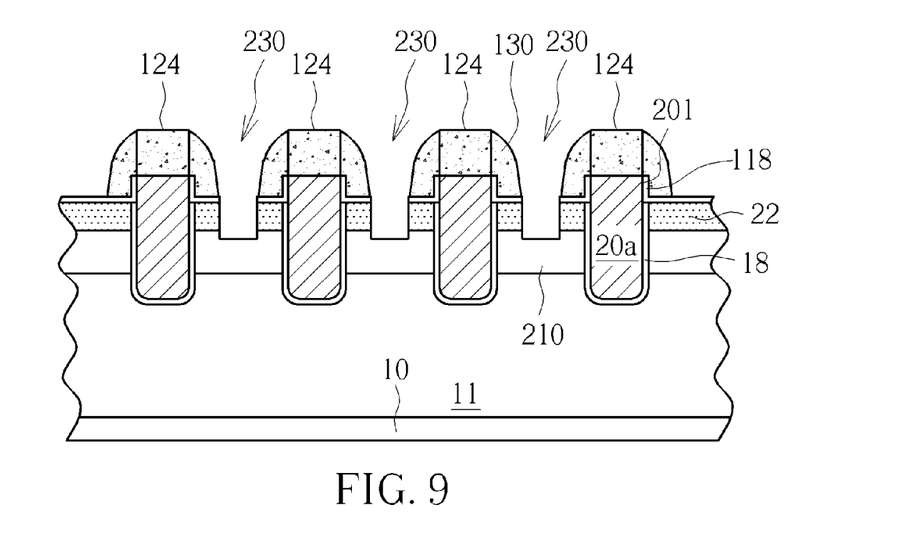
FIG. 9 to FIG. 11 depict another embodiment of this invention.
Figure 10:
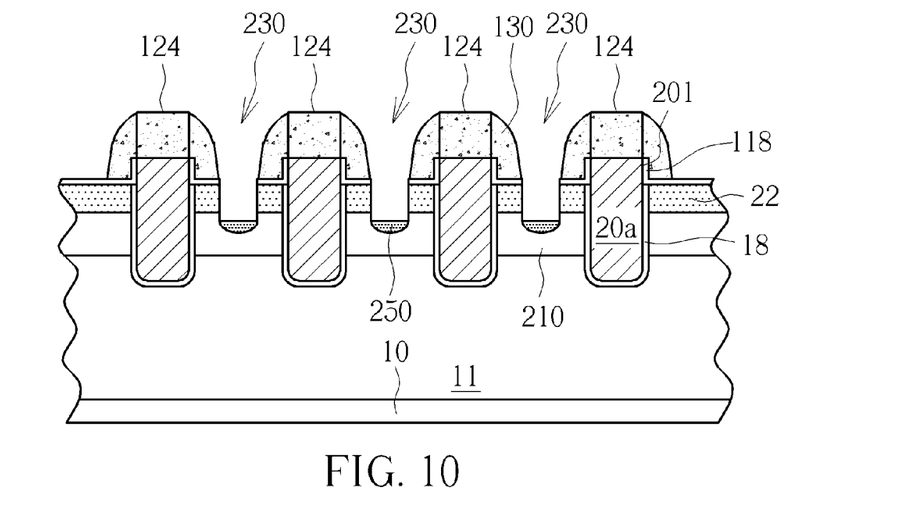
Figure 11:
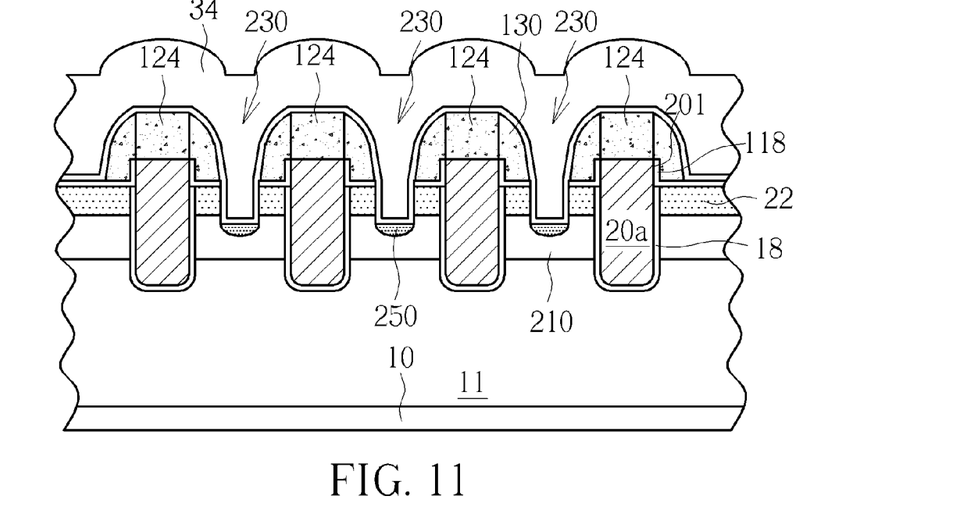

FIG. 9 to FIG. 11 depict another embodiment of this invention. As shown in FIG. 9 to FIG. 11, after forming the spacer 130, the dielectric layer 140 in FIG. 7 may be omitted and the subsequent resist pattern 155 may be skipped. Instead, using the cap layer 124 and the spacer 130 as an etching hard mask, the epitaxial layer 11 is etched to a predetermined depth, thereby forming a self-aligned contact hole 230. Thereafter, contact hole ion implantation process is performed to form contact doping region 250 at the bottom of the contact hole 230. The barrier layer and the metal layer 34 are then deposited to fill the contact hole 230.

Figure 12:
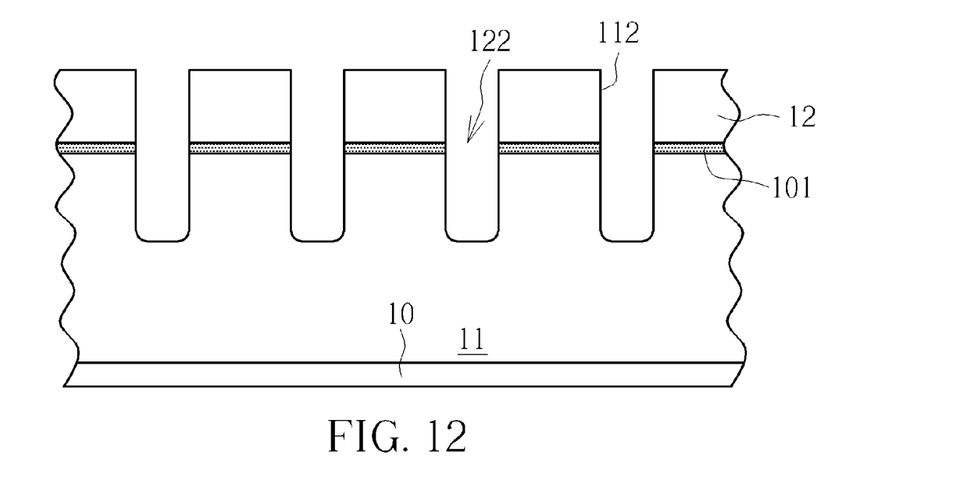
FIGS. 12-18 are schematic, cross-sectional diagrams illustrating a method for fabricating a trench type power transistor device in accordance with another embodiment of the invention.

FIGS. 12-18 are schematic, cross-sectional diagrams illustrating a method for fabricating a trench type power transistor device in accordance with another embodiment of the invention. As shown in FIG. 12, likewise, a semiconductor substrate 10, such as an N type heavily doped silicon substrate, is provided. The semiconductor substrate 10 may act as a drain of the semiconductor transistor device. Subsequently, an epitaxial process is performed to form an epitaxial layer 11 such as an N type epitaxial silicon layer on the semiconductor substrate 10. A nitride doping region 101 is then formed at the surface of the epitaxial layer 11. A hard mask layer 12 such as a silicon oxide or silicon nitride may be formed on the epitaxial layer 11. A lithographic process and an etching process are performed to form openings 112 in the hard mask layer 12. Subsequently, a dry etching process is performed to etch the epitaxial layer 11 through the openings 112 to a predetermined depth within epitaxial layer 11, thereby forming gate trenches 122.

Figure 13:
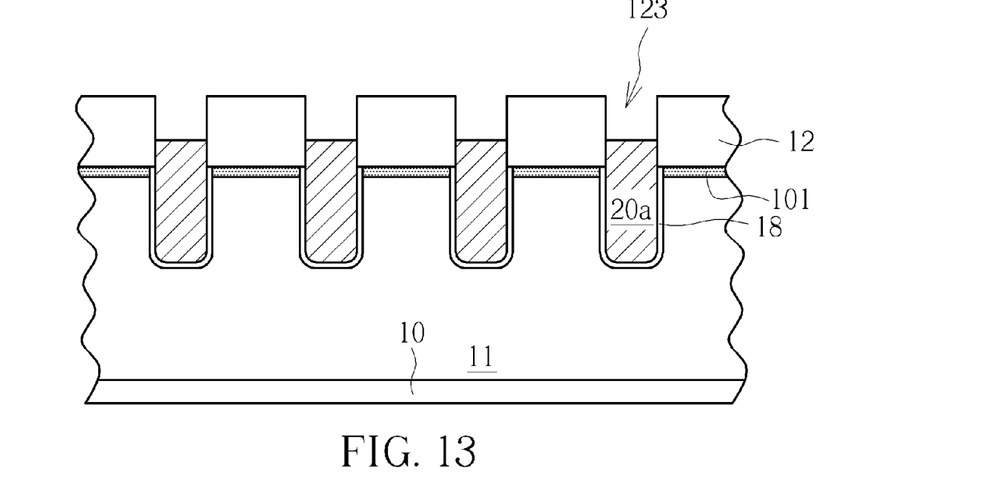

As shown in FIG. 13, a thermal oxidization process is performed to form a gate oxide layer 18 on the surface of each of the gate trenches 122. A CVD process is carried out to deposit a polysilicon layer (not shown) in a blanket manner. The deposited polysilicon layer fills the gate trenches 122. Subsequently, an etching process is performed to etch away a portion of the polysilicon layer to thereby separate trench gates 20a within the gate trenches 122. At this point, a recess region 123 is formed on the trench gate 20a.

Figure 14:
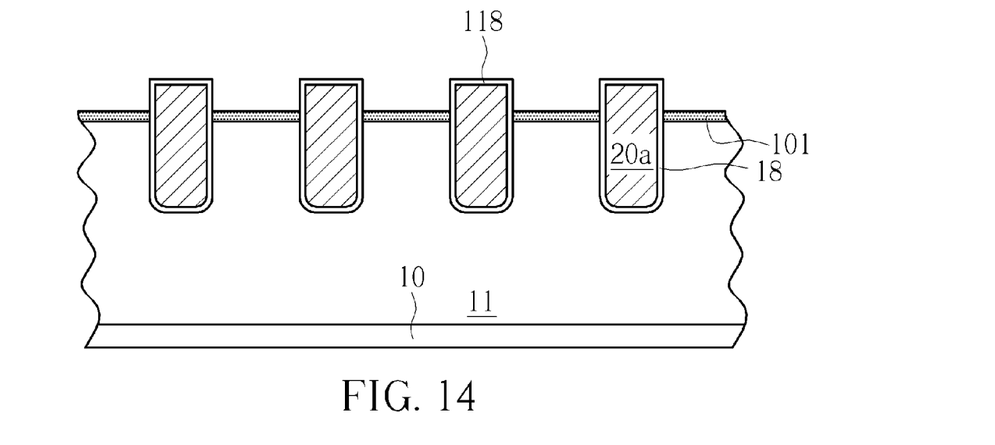

As shown in FIG. 14, the hard mask layer 12 is selectively removed. To remove the hard mask layer 12, a photoresist may be coated and filled into the recess region 123. The photoresist may be etched back. After the hard mask layer 12 is revealed, the hard mask layer 12 is removed and the photoresist is then removed. At this point, the trench gate 20a slightly protrudes from the surface of the epitaxial layer 11. An oxidization process is then performed to form a silicon oxide layer 118 on the exposed surface of the trench gate 20a.

Figure 15:
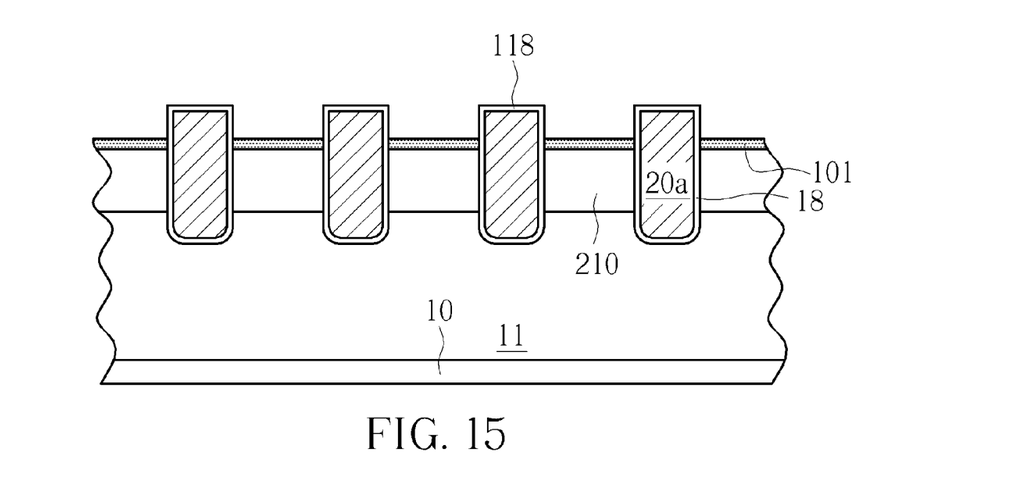

As shown in FIG. 15, an ion implantation process is carried out to form an ion well 210 such as a P well in the epitaxial layer 11. A thermal process is then performed to drive in or diffuse the implanted dopants. A lithographic process may be carried out prior to the aforesaid ion implantation process in order to define the well region to be implanted.

Figure 16:
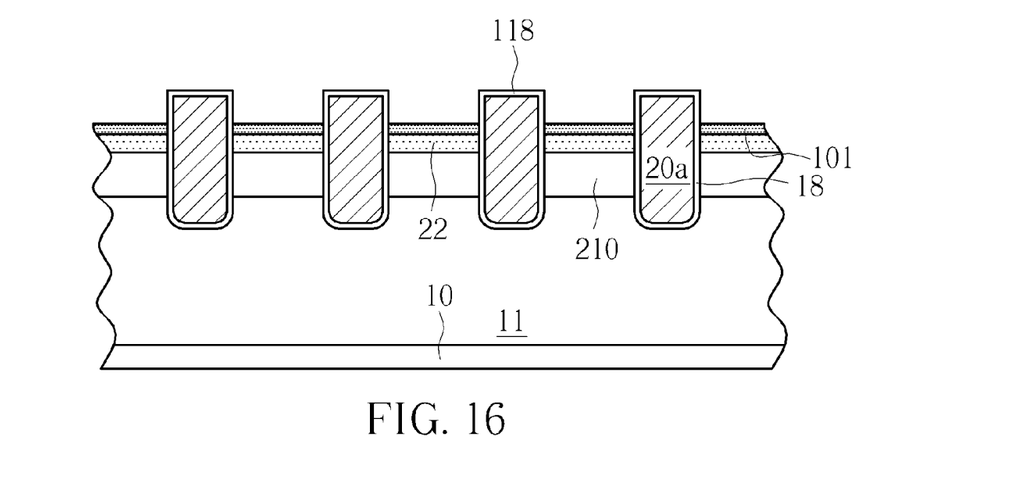

As shown in FIG. 16, another ion implantation process is performed to form source doping region 22 such as N type source doping region within the ion well 210. A thermal treatment may be performed to thermally drive in and diffuse the implanted dopants. Likewise, a lithographic process may be carried out prior to the aforesaid ion implantation process in order to define the source region to be implanted.

Figure 17:
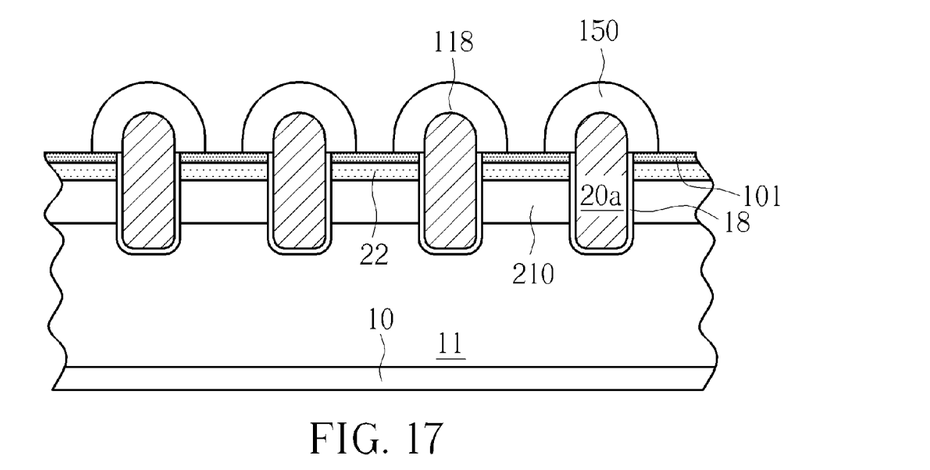

As shown in FIG. 17, an oxidization process is then performed to selectively oxidize the upper portion of the trench gate 20a that protrudes from the surface of the epitaxial layer 11, thereby forming an oxide capping layer 150 that laterally extends to cover a portion of the epitaxial layer 11. Due to the nitride doping region 101, the surface of the epitaxial layer 11 is substantially not oxidized during the aforesaid oxidization process.

Figure 18:
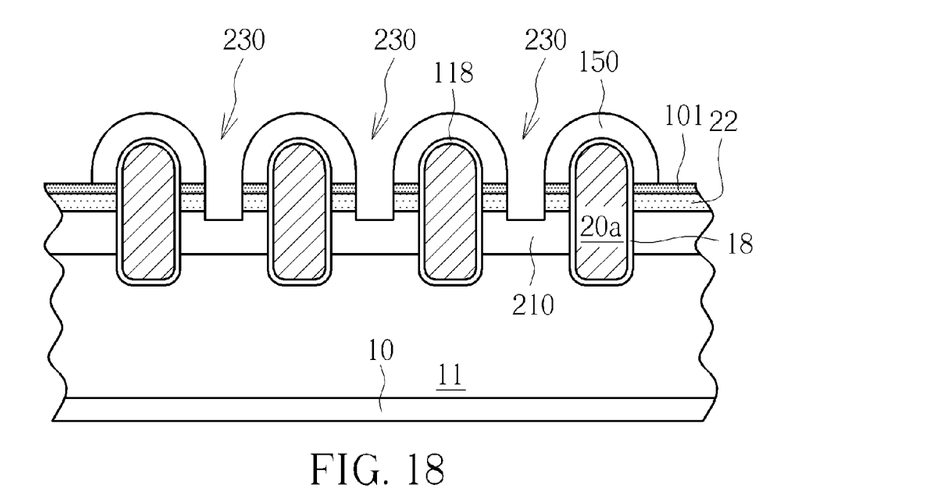

As shown in FIG. 18, subsequently, using the oxide capping layer 150 as an etching hard mask, the epitaxial layer 11 is selectively etched to a predetermined depth, thereby forming a self-aligned contact hole 230. Thereafter, similar to the steps depicted in FIGS. 10-11, contact hole ion implantation process may be performed to form contact doping region 250 at the bottom of the contact hole 230. The barrier layer and the metal layer 34 is then deposited to fill the contact hole 230.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a trench type transistor device, comprising:
   providing a semiconductor substrate;
   forming an epitaxial layer on the semiconductor substrate;
   forming a hard mask layer on the epitaxial layer, the hard mask layer comprising at least an opening;
   through the opening, etching a gate trench into the epitaxial layer;
   forming a gate oxide layer in the gate trench;
   forming a gate within the gate trench, wherein the gate within the gate trench has a top surface that is higher than a top surface of the epitaxial layer;

forming a cap layer on the gate;
after forming the cap layer, removing the hard mask layer to thereby revealing the top surface of the epitaxial layer;
after removing the hard mask layer, performing an oxidation to form a silicon oxide layer at least on the top surface of the epitaxial layer;
after forming the silicon oxide layer on the top surface of the epitaxial layer, forming an ion well within the epitaxial layer;
forming a source doping region within the ion well;
forming a spacer on sidewall of the cap layer and the gate; and
self-aligned etching the epitaxial layer using the cap layer and the spacer as an etching hard mask, thereby forming a contact hole.

2. The method for fabricating a trench type transistor device according to claim 1 wherein the semiconductor substrate is an N type heavily doped silicon substrate and acts as a drain of the trench type transistor device.

3. The method for fabricating a trench type transistor device according to claim 2 wherein the epitaxial layer is an N type epitaxial silicon layer.

4. The method for fabricating a trench type transistor device according to claim 3 wherein the ion well is a P well.

5. The method for fabricating a trench type transistor device according to claim 4 wherein the source doping region is an N type source doping region.

6. The method for fabricating a trench type transistor device according to claim 1 wherein the hard mask comprises silicon oxide or silicon nitride.

7. The method for fabricating a trench type transistor device according to claim 1 wherein the cap layer comprises silicon nitride.

8. The method for fabricating a trench type transistor device according to claim 1 wherein the spacer comprises silicon nitride.

* * * * *